(12) United States Patent
Lee

(10) Patent No.: US 7,713,808 B2
(45) Date of Patent: May 11, 2010

(54) CMOS IMAGE SENSOR AND METHOD FOR FABRICATING THE SAME

(75) Inventor: Joung Ho Lee, Seoul (KR)

(73) Assignee: Dongbu Hitek Co., Ltd., Seoul (KR)

( * ) Notice: Subject to any disclaimer, the term of this patent is extended or adjusted under 35 U.S.C. 154(b) by 135 days.

(21) Appl. No.: 11/846,289

(22) Filed: Aug. 28, 2007

(65) Prior Publication Data

US 2008/0157138 A1    Jul. 3, 2008

(30) Foreign Application Priority Data

Dec. 27, 2006   (KR) ..................... 10-2006-0135685

(51) Int. Cl.
*H01L 21/8238*   (2006.01)
*H01L 21/00*   (2006.01)
*H01L 31/062*   (2006.01)
*H01L 31/036*   (2006.01)
*H01L 29/04*   (2006.01)
*H01L 21/329*   (2006.01)
*H01L 21/04*   (2006.01)

(52) U.S. Cl. .................... 438/200; 438/59; 438/923; 257/292; 257/59; 257/E21.352; 257/E21.057; 257/E21.058

(58) Field of Classification Search ............... 438/200, 438/59, 923; 257/292, 59, E21.352, E21.057, 257/E21.058
See application file for complete search history.

(56) References Cited

U.S. PATENT DOCUMENTS

| | | | |
|---|---|---|---|
| 5,466,612 A | 11/1995 | Fuse et al. | |
| 7,005,315 B2 * | 2/2006 | Hong et al. | ............. 438/73 |
| 2003/0127666 A1 * | 7/2003 | Lee | ............. 257/225 |
| 2007/0012963 A1 * | 1/2007 | Han | ............. 257/290 |
| 2007/0037313 A1 | 2/2007 | Lee | |

FOREIGN PATENT DOCUMENTS

KR   10-0640980   10/2006

* cited by examiner

*Primary Examiner*—Luan C Thai
(74) *Attorney, Agent, or Firm*—Workman Nydegger

(57) ABSTRACT

A complementary metal oxide semiconductor (CMOS) image sensor (CIS) and a method for fabricating the same. A method for fabricating a CIS includes implanting first conductive type dopants in a semiconductor substrate to form a photodiode region in a surface of the semiconductor substrate, implanting second conductive type dopants in the photo diode region to form a second conductive type diffusion region, and implanting fluorine ions in the second conductive type diffusion region to form a fluorine diffusion region.

8 Claims, 6 Drawing Sheets

CMOS IMAGE SENSOR AND METHOD FOR FABRICATING THE SAME

CROSS-REFERENCE TO RELATED APPLICATION

This application claims priority to Korean Application No. 10-2006-0135685, filed on Dec. 27, 2006, which is incorporated herein by reference in its entirety.

BACKGROUND

1. Field of the Invention

The present invention relates to a CMOS image sensor and a method for fabricating the same.

2. Description of the Related Art

Generally, an image sensor is a semiconductor device used to convert an optical image into an electrical signal. Image sensors may generally be classified as either charge-coupled devices (CCDs) or complementary metal oxide semiconductor (CMOS) image sensors (CISs).

A CCD has a plurality of photodiodes (PDs) arranged in matrix form for converting an optical signal into an electrical signal. A CCD includes a plurality of vertical charge coupled devices (VCCDs), a horizontal charge coupled device (HCCD), and a sense amplifier. The VCCDs are formed between respective PDs arranged in matrix form and transfers charges generated in each PD in a vertical direction. The HCCD transfers the charges transferred by each VCCD in a horizontal direction. The sense amplifier senses the horizontally transferred charges and generates an electrical signal therefrom.

CCDs are complex and have high power consumption. In addition, the fabrication process of CCDs is complex because the process requires a multi-step photo process. It is also difficult to decrease the size of CCDs because of the difficulty in integrating a controller, a signal processor, and an analog-to-digital (A/D) converter in a chip of the CCD.

Recently, effort has been directed to producing CISs that are capable of overcoming the defects of CCDs. A CIS is a device employing MOS transistors corresponding to the number of unit pixels formed in a semiconductor substrate using a CMOS fabrication technology. A CIS is capable of sequentially detecting, by the respective MOS transistors, an output from each unit pixel. In CMOS fabrication technology, a controller and a signal processor are used as peripheral circuits. More particularly, in a CIS, a photodiode and a MOS transistor are formed within a unit pixel. A CIS can thereby sequentially detect an electrical signal of each unit pixel in order to capture an image.

Using CMOS fabrication technology, a CIS has relatively low power consumption and a relatively simple fabrication process in part because of the decreased number of photo process steps. Further, due in part to the integration of a controller, a signal processor, an A/D converter, and the like into a CIS chip, it is less difficult to decrease the size of a CIS than it is to decrease the size of a CCD. Accordingly, CISs are widely used in a variety of application fields, such as digital still cameras or digital video cameras for example.

FIGS. 1A-1E disclose a prior art method for fabricating a CIS. As disclosed in FIG. 1A, a low-concentration $P^-$ type epitaxial layer 62 is formed in a high-concentration $P^{++}$ type semiconductor substrate 61 using an epitaxial process. An active region and a device isolation region are defined in the semiconductor substrate 61. A device isolation film 63 is then formed in the device isolation region using a shallow trench isolation (STI) process. Thereafter, a gate insulating film 64 and a conductive layer, such as a high-concentration polycrystalline silicon layer for example, are sequentially deposited on a whole surface of the epitaxial layer 62 including the device isolation film 63. The conductive layer and the gate insulating film 64 are then selectively removed, thereby forming a gate electrode 65.

As disclosed in FIG. 1B, a first photoresist film 66 is coated above a whole surface of the semiconductor substrate 61 and is patterned to expose each blue, green, and red photodiode region in an exposure and development process. Subsequently, low-concentration N type dopants are implanted in the epitaxial layer 62 with the patterned first photoresist film 66 as a mask, thereby forming an $N^-$ type diffusion region 67 that is the blue, green, and red photodiode region. When the $N^-$ type diffusion region 67 for the photodiode region is formed, ion implantation of phosphorous (P) is implemented. In order to enhance the efficiency of signal transmission, a series of two processes are performed with different ion implantation energies.

As disclosed in FIG. 1C, the first photoresist film 66 is thoroughly removed. An insulation film is then deposited and etched back above an entire surface of the semiconductor substrate 61. Thus, insulating sidewalls 68 are formed at both side surfaces of the gate electrode 65. After a second photoresist film 69 is coated above an entire surface of the semiconductor substrate 61, it is patterned to cover the photodiode region and expose a source/drain region of each transistor through an exposure and development process. Next, high-concentration $N^+$ type dopants are implanted in the exposed source/drain region using the patterned second photoresist film 69 as a mask, thereby forming an $N^+$ type diffusion region (a floated diffusion region) 70.

As disclosed in FIG. 1D, the second photoresist film 69 is removed. After a third photoresist film 71 is coated above an entire surface of the semiconductor substrate 61, it is patterned to expose each photodiode region by an exposure and development process. $P^0$ type dopants, such as $BF_2^+$ for example, are implanted in the photodiode region including the N type diffusion region 67, using the patterned third photoresist film 71 as a mask. Thus, a $P^0$ type diffusion region 72 is formed on the N type diffusion region 62. In this connection, electrons may be generated in a surface of a photodiode due to a defect of the interface between the photodiode and the semiconductor substrate 61. This may cause a movement of the electrons to the photodiode region to thereby generate an undesired signal in the surface. Thus, the $P^0$ type diffusion region 72 with many holes formed at its upper surface serves to remove the electrons by allowing the electrons to couple with the holes. However, a portion of the electrons remains without removing or coupling with holes and thus, causes a dark current thereby deteriorating a product characteristic of the CMOS sensor.

As disclosed in FIG. 1E, the third photoresist film 71 is removed. The semiconductor substrate 61 is heat-treated, thereby promoting diffusion in each impurity diffusion region. As a P type junction layer is formed thicker by P type ion implantation in order to remove a dark current, dark current decreases but a light sensitivity also decreases. Thus, after ion implantation, P type dopants should not be diffused into the photodiode region.

FIG. 2 discloses a relationship between silicon depth and dopant concentration in a photodiode region formed by primary and secondary ion implantation when the prior art CIS of FIGS. 1A-1E is fabricated. As disclosed in FIG. 2, a series of two N type ion implantations are performed at different energy of 160 KeV and 100 KeV, respectively, to form a photodiode region. Low energy ion implantation is performed at an ion implantation angle of between 4 degrees and 10 degrees. High energy ion implantation is performed at an ion implantation angle of zero degrees.

However, in the prior art, there is a limitation in controlling the diffusion of boron (B) having a small mass and fast diffusion. Accordingly, low energy ion implantation makes it difficult to realize a concentration profile in a desired form.

As disclosed in FIG. 3A, electrons that are a cause of a dark current generated in a surface of a photodiode are mostly removed by coupling with many P type holes, but a part of the electrons naturally flows into an N type region whose energy is low. This leads to the generation of an unnecessary signal to thereby produce a noise in images. Also, it is difficult to control the diffusion of P type dopants into the N type region and therefore, a light sensitivity characteristic, in particular, sensitivity to a blue color-based short wavelength light is deteriorated.

In the prior art, as described above, ion implantation of phosphorous (P) or arsenic (As), which are N type dopants, is performed on the photodiode region of the CIS. After that, ion implantation of $BF_2^+$, which is a P type dopant, is implemented. A theoretical approach to the diffusion of boron (B) is mainly affected from a Transient Enhanced Diffusion (TED) effect caused by the interstitial between lattices. Accordingly, in the case of low energy, as disclosed in FIG. 3B, it is difficult to control a doping profile (a concentration profile) when a thermal process is performed after ion implantation of boron.

SUMMARY OF EXAMPLE EMBODIMENTS

In general, example embodiments of the invention relate to a complementary metal oxide semiconductor (CMOS) image sensor (CIS) and a method for fabricating the same. In one example embodiment, the example method for fabricating the CIS facilitates control of a doping profile and improves dark current and light sensitivity characteristics of a photodiode.

In one example embodiment, a method for fabricating a CIS includes implanting first conductive type dopants in a semiconductor substrate to form a photodiode region in a surface of the semiconductor substrate, implanting second conductive type dopants in the photo diode region to form a second conductive type diffusion region, and implanting fluorine ions in the second conductive type diffusion region to form a fluorine diffusion region.

In another example embodiment, a CIS includes an epitaxial layer formed in a semiconductor substrate, a photodiode region formed in the epitaxial layer, a first diffusion region formed in the photo diode region, and a second diffusion region formed in the first diffusion region.

BRIEF DESCRIPTION OF THE DRAWINGS

Aspects of example embodiments of the invention will become apparent from the following description of example embodiments given in conjunction with the accompanying drawings, in which.

DETAILED DESCRIPTION OF EXAMPLE EMBODIMENTS

Figure 1A:
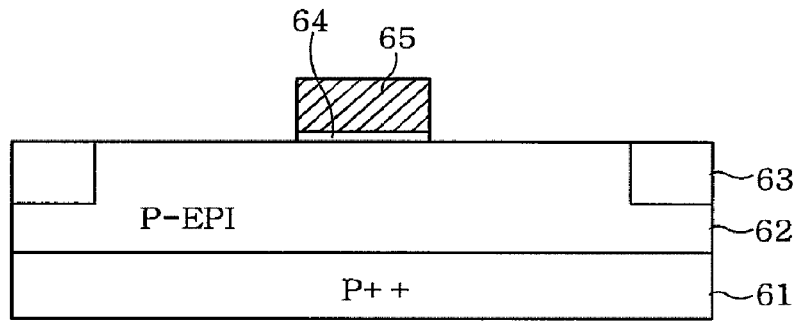
FIGS. 1A-1E are cross-sectional views illustrating a prior art method for fabricating a CIS.
Figure 1B:
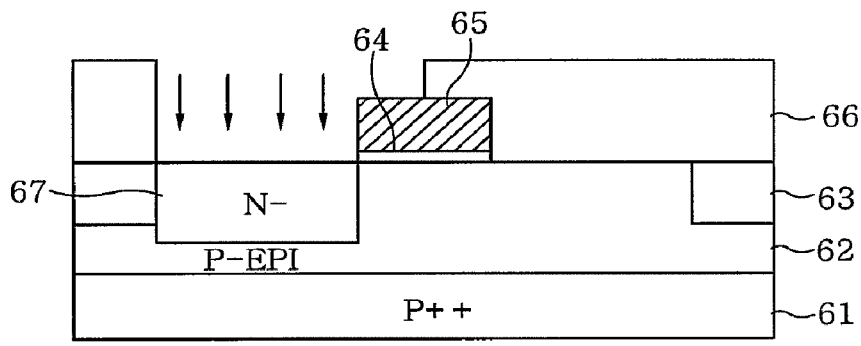
Figure 1C:
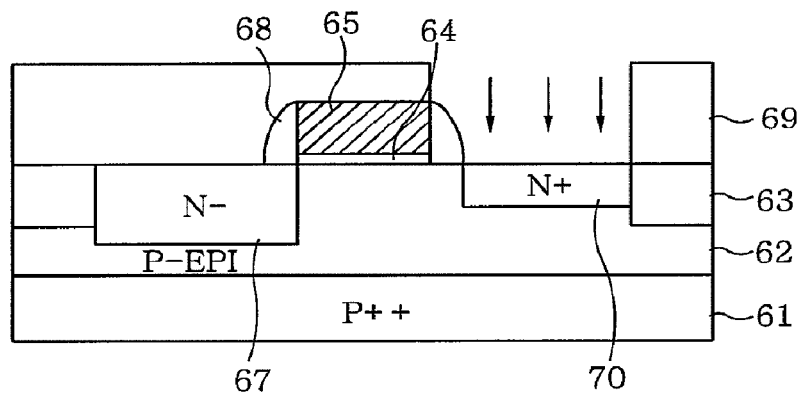
Figure 1D:
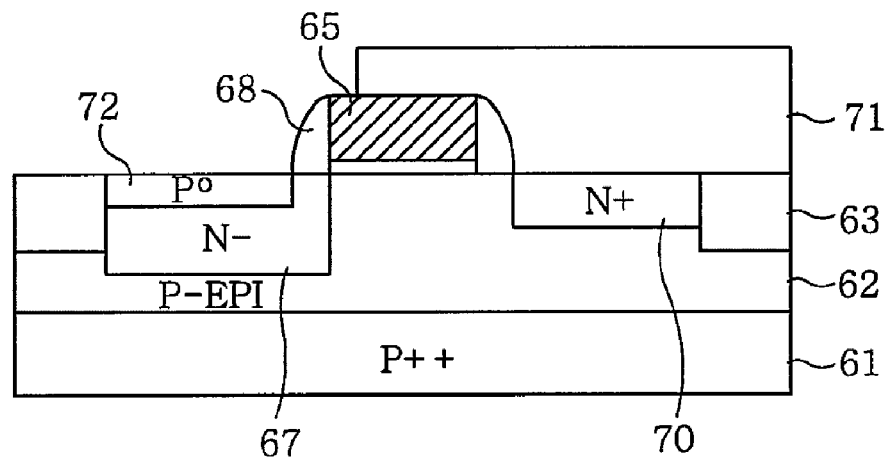
Figure 1E:
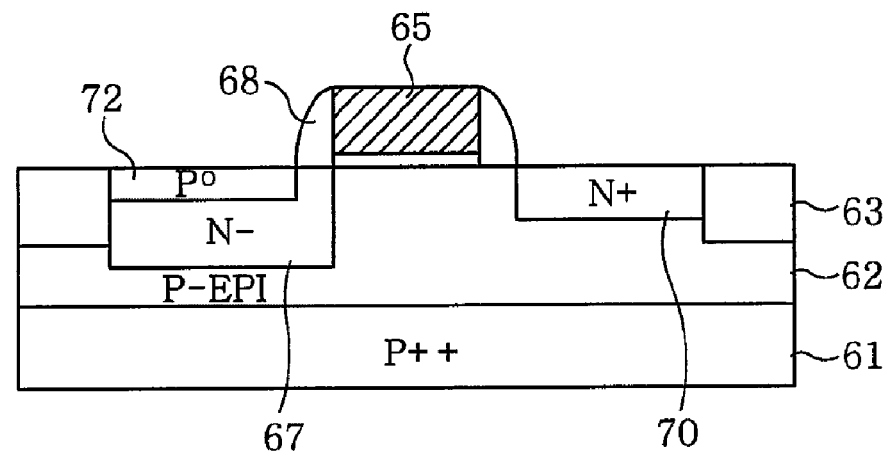
Figure 2:
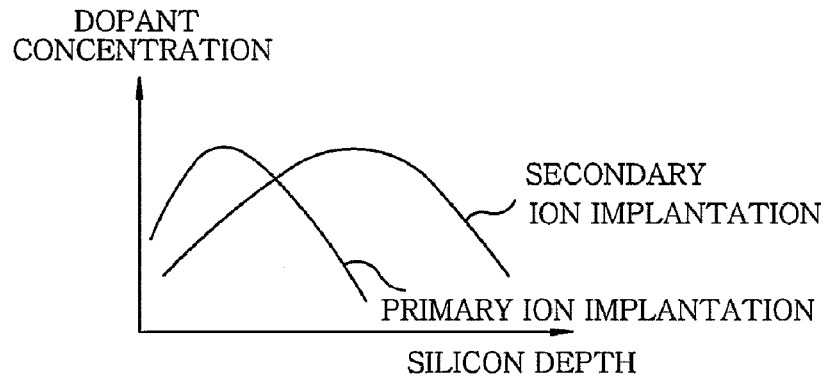
FIG. 2 is a graph illustrating a relationship between silicon depth and dopant concentration in a photodiode region formed by primary and secondary ion implantation when fabricating the prior art CIS of FIGS. 1A-1E.
Figure 3A:
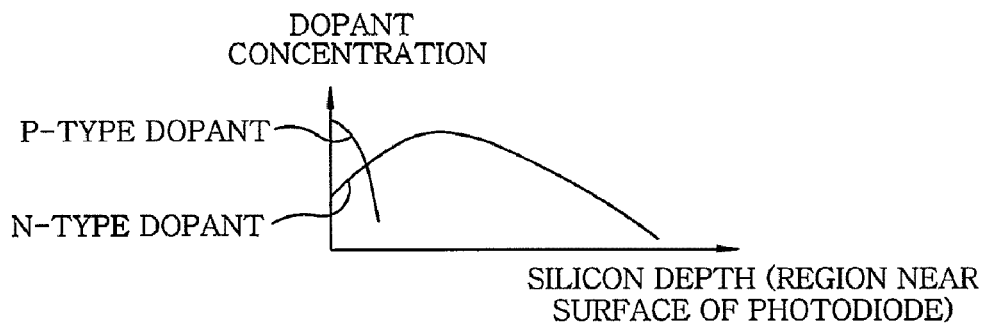
FIG. 3A is an energy diagram based on a concentration profile of P type and N type dopants near a surface of a photodiode region in the prior art CIS of FIGS. 1A-1E.
Figure 3B:
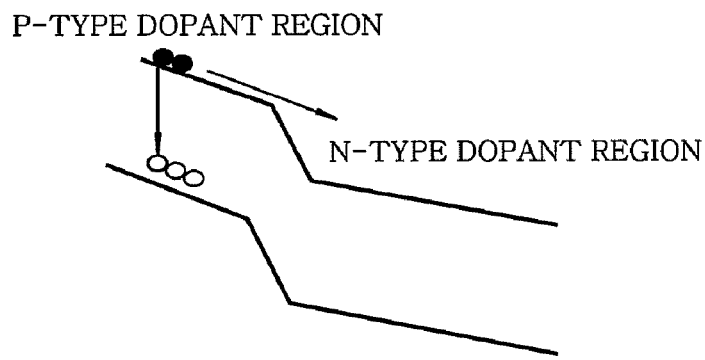
FIG. 3B is a diagram illustrating the diffusion of boron by fluorine ion implantation in the prior art CIS of FIGS. 1A-1E.

Hereinafter, example embodiments of the invention will be described in detail with reference to the accompanying drawings.

Referring now to FIGS. 4A-4F, an example method for fabricating an example CIS is disclosed. As disclosed in FIG. 4A, a low-concentration P⁻ type epitaxial layer 102 is formed in a semiconductor substrate 101, such as a high-concentration P⁺⁺ type single crystalline silicon for example, using an epitaxial process. The epitaxial layer 102 is formed to have a large and deep depletion region in a photodiode, thereby enhancing a capability of a low voltage photodiode to collect light charges and also improving a light sensitivity thereof. Next, an active region and a device isolation region are defined in the semiconductor substrate 101. A device isolation film 103 is then formed in the device isolation region using a Shallow Trench Isolation (STI) process.

An example method for forming the device isolation film 103 will now be described. First, a pad oxide film, a pad nitride film, and a Tetra Ethyl Ortho Silicate (TEOS) oxide film are sequentially formed over the semiconductor substrate 101. A photoresist film is then formed over the TEOS oxide film. Next, the photoresist film is exposed and patterned using a mask defining the active region and the device isolation region. Then, the photoresist film of the device isolation region is removed. Next, the pad oxide film, the pad nitride film, and the TEOS oxide film of the device isolation region are selectively removed with the patterned photoresist film as a mask. The semiconductor substrate corresponding to the device isolation region is then etched to a predetermined depth with the patterned pad oxide film, pad nitride film, and TEOS oxide film as a mask, thereby forming a trench. Next, the photoresist film is then removed. Subsequently, insulation material is buried in the trench, thereby forming the device isolation film 103 in the trench. The pad oxide film, the pad nitride film, and the TEOS oxide film are then removed.

A gate insulating film 104 and a conductive layer, such as a high-concentration polycrystalline silicon layer for example, are sequentially deposited on a whole surface of the epitaxial layer 102 including the device isolation film 103. The gate insulating film 104 may be either formed in a thermal oxidation process or may be formed in a chemical vapor deposition (CVD) method. The conductive layer and the gate insulating film 104 are selectively removed, thereby forming a gate electrode 105. The gate electrode 105 becomes a gate electrode of a transfer transistor.

Figure 4A:
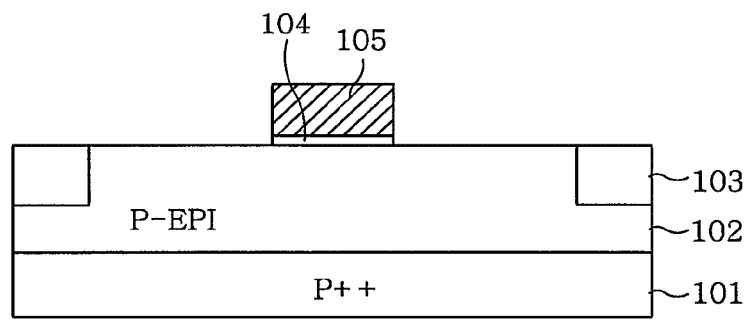
FIGS. 4A-4F are cross-sectional diagrams illustrating an example method for fabricating an example CIS.
Figure 4B:
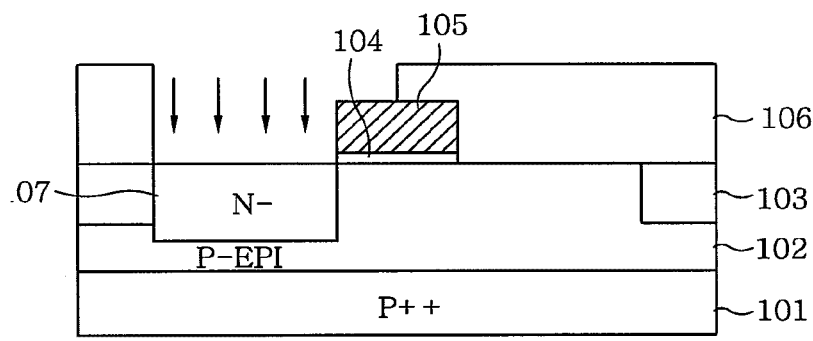

As disclosed in FIG. 4B, a first photoresist film 106 is coated above a whole surface of the semiconductor substrate 101 including the gate electrode 105 and is patterned to expose each blue, green, and red photodiode region in an exposure and development process. Next, low-concentration N type dopants are implanted in the epitaxial layer 102 with the patterned first photoresist film 106 as a mask, thereby forming an N⁻ type diffusion region 107 that is the blue, green, and red photo diode region.

When the N⁻ type diffusion region 107 that is the photodiode region is formed, ion implantation of phosphorous (P) is implemented. In order to enhance the efficiency of signal transmission, a series of two processes are performed with different ion implantation energies. In other words, N type ion implantation for forming the photodiode region is consecutively performed at energies of about 160 KeV and about 100 KeV, respectively. Low energy ion implantation is performed at an ion implantation angle of between about 4 degrees and about 10 degrees. High energy ion implantation is performed at an ion implantation angle of zero degree.

Figure 4C:
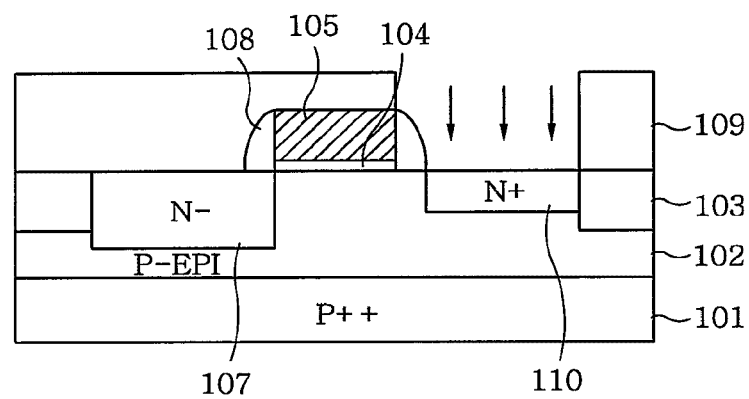

As disclosed in FIG. 4C, the first photoresist film 106 is removed. An insulation film is deposited and etched above a whole surface of the semiconductor substrate 101. Thus, insulating sidewalls 108 are formed at both side surfaces of the gate electrode 105. Next, a second photoresist film 109 is coated above a whole surface of the semiconductor substrate 101. The second photoresist film 109 is then patterned to cover the photodiode region and expose a source/drain region of each transistor by an exposure and development process.

In the example process discussed above, before the forming of the insulating sidewalls 108, low-concentration N type or P type dopants may be implanted in the semiconductor substrate 101 at both sides of the gate electrode 105. Thus, a lightly doped drain (LDD) region (not shown) may be formed in the semiconductor substrate 101 at both sides of the gate electrode 105. Thereafter, high-concentration $N^+$ type dopants are implanted in the exposed source/drain region using the patterned second photoresist film 109 as a mask. Thus, an $N^+$ type diffusion region (a floated diffusion region) 10 is formed in the exposed source/drain region.

Figure 4D:
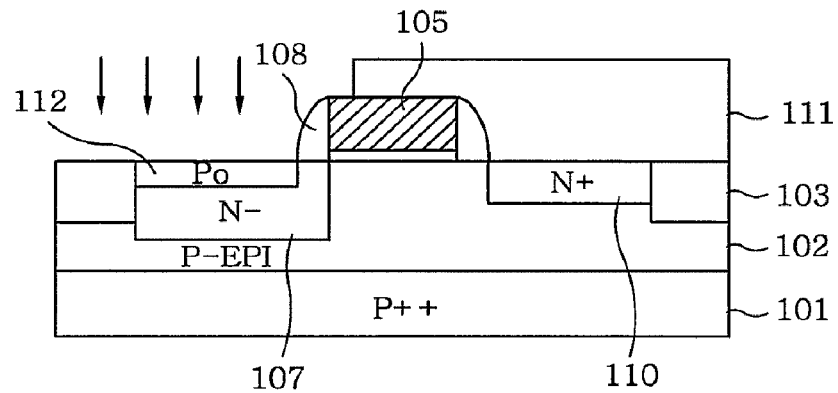

As disclosed in FIG. 4D, the second photoresist film 109 is removed. Subsequently, a third photoresist film 111 is coated above a whole surface of the semiconductor substrate 101 and is then patterned to expose each photodiode region by an exposure and development process. Conductive type ($P^0$ type) dopants are implanted in the epitaxial layer 102 including the $N^-$ type diffusion region 107, using the patterned third photoresist film 111 as a mask. Thus, a $P^0$ type diffusion region 112 is formed in a surface of the epitaxial layer 102. The dopants implanted in the $P^0$ type diffusion region 112 are boron difluoride ($BF_2$) ions. The $BF_2$ ions are implanted at a concentration of between about $1 \times 10^{16}$ atoms/cm$^2$ and about $5 \times 10^{17}$ atoms/cm$^2$ and an implantation energy of between about 5 KeV and about 20 KeV.

Figure 4E:
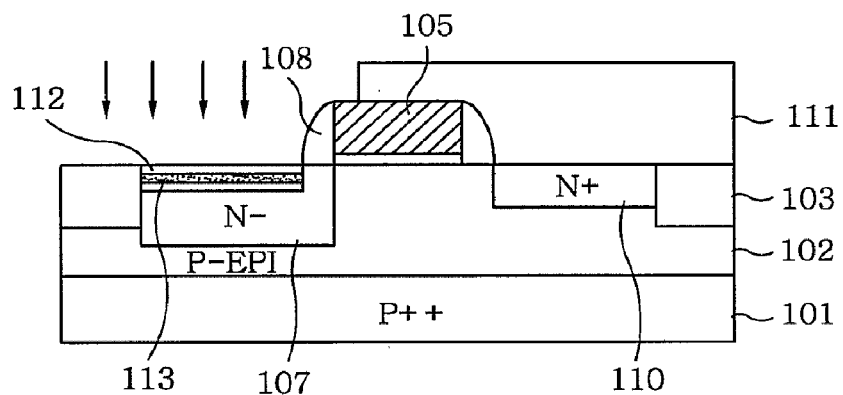

As disclosed in FIG. 4E, fluorine (F) ions are implanted in the $P^0$ type diffusion region 112 using the third photo resist film 111 as a mask. As a result, a fluorine diffusion region 113 is formed in the $P^0$ type diffusion region 112. In this regard, after the implantation of $BF_2^+$ ion for forming a P type junction in the $N^-$ type diffusion region 107, fluorine (F) ions are implanted at a lower end of a boron (B) peak, thereby decreasing the flow of undesired electrons of a photo diode interface to an N type junction and thus avoiding a dark current.

For example, after $BF_2^+$ ions are implanted at an ion implantation energy of about 10 KeV, fluorine ($F^+$) ions are implanted at an ion implantation energy of about 6 KeV; or after $BF_2^+$ ions are implanted at an ion implantation energy of about 20 KeV, fluorine ($F^+$) ions are implanted at an ion implantation energy of about 8 KeV. Other ion implantation energies and amounts are also possible depending on desired operating characteristics of the example CIS.

Figure 4F:
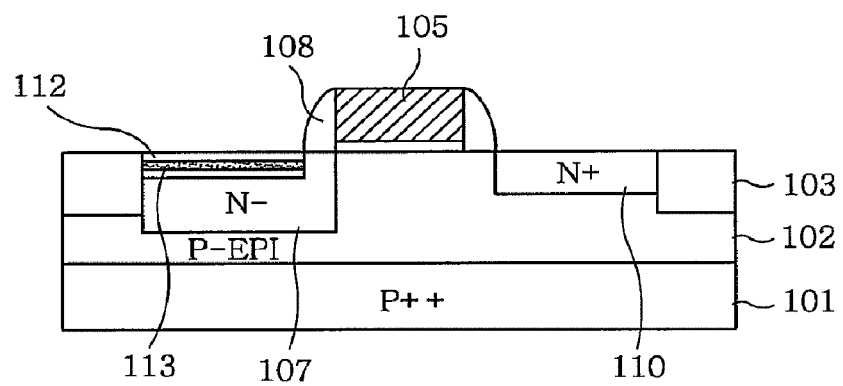

As disclosed in FIG. 4F, the third photo resist film 111 is removed, and the semiconductor substrate 101 is heat-treated, thereby promoting diffusion in each impurity diffusion region.

Though subsequent processes are not shown in the drawings, a plurality of metal wirings can be formed in an interlayer insulation film at a whole surface of the resultant. Subsequently, a color filter layer and a micro lens can be formed.

Figure 5A:
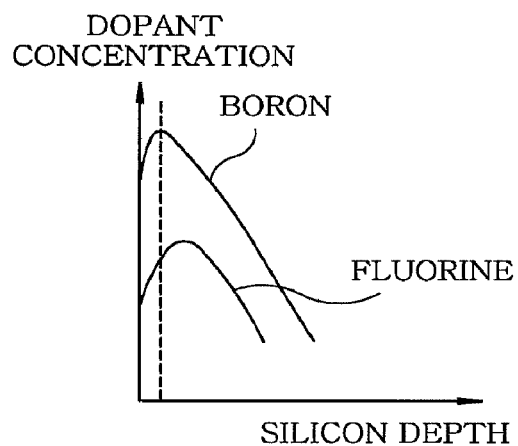
FIG. 5A is a graph illustrating generally a relationship between a boron concentration profile and a fluorine concentration profile.
Figure 5B:
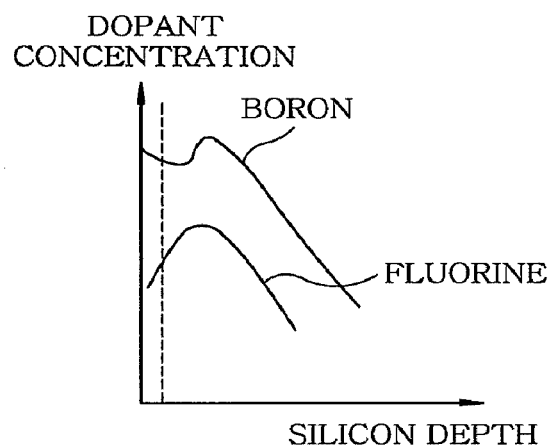
FIG. 5B is a graph illustrating the relationship between the boron and the fluorine concentration profiles at the time of fluorine ion implantation in the example CIS of FIGS. 4A-4F.

FIGS. 5A and 5B disclose a relationship between a boron concentration profile and a fluorine concentration profile. FIG. 5B specifically represents the relationship of the boron and fluorine concentration profiles at the time of fluorine ion implantation in the example CIS of FIGS. 4A-4F.

As disclosed in FIGS. 5A and 5B, ion implantation of fluorine (F) is performed such that the fluorine (F) concentration profile, that is, a fluorine ion implantation energy, is positioned somewhat below a boron peak of the boron concentration profile in order to suppress the diffusion of boron ions.

Figure 6:
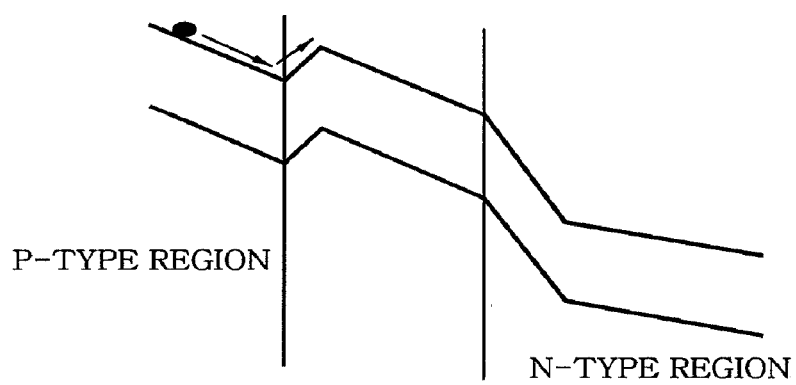
FIG. 6 is a diagram illustrating a state where the diffusion of boron is suppressed by fluorine ion implantation in the example CIS of FIGS. 4A-4F.

FIG. 6 is a diagram illustrating a state where the diffusion of boron is suppressed by fluorine ion implantation in the example CIS of FIGS. 4A-4F. As disclosed in FIG. 6, electrons generated in the $P^0$ type diffusion region 112 would not easily flow into the N type diffusion region 107 because of an energy barrier. Accordingly, it is possible to suppress the generation of a dark current and thus, to improve the characteristics of the CIS.

The example CIS of FIGS. 4A-4F is implanted with P type dopants in a photodiode region and then is implanted with fluorine ions in the photodiode region implanted with the P type dopants. Thus, the suppression of a noise of electrons generated at interface results in an improvement in a dark current characteristic. In addition, the suppression of the diffusion of boron results in an improvement in sensitivity to a short-wavelength light.

While the invention has been disclosed and described with respect to some example embodiments, it will be understood by those skilled in the art that various changes and modifications may be made without departing from the scope of the invention as defined in the following claims.

What is claimed is:

1. A method for fabricating a CIS, the method comprising:
   implanting first conductive type dopants in a semiconductor substrate to form a photodiode region in a surface of the semiconductor substrate;
   implanting second conductive type dopants in the photodiode photodiode region to form a second conductive type diffusion region; and
   implanting fluorine ions in the second conductive type diffusion region to form a fluorine diffusion region.

2. The method of claim 1, wherein the fluorine ions are implanted with controlled ion implantation energy and implantation amount depending on a product characteristic.

3. The method of claim 1, further comprising:
   performing a heat treatment for the semiconductor substrate after the forming of the fluorine diffusion region.

4. The method of claim 1, wherein the second conductive type dopants include boron difluoride (BF2) ions.

5. A CIS comprising:
   an epitaxial layer formed in a semiconductor substrate;
   a photodiode region formed in the epitaxial layer;
   a first diffusion region formed in the photodiode region; and
   a second diffusion region formed in the first diffusion region
   wherein the second diffusion region includes fluorine ions.

6. The CIS of claim 5, wherein the photodiode region has first conductive type dopants implanted in the epitaxial layer.

7. The CIS of claim 5, wherein the first diffusion region has second conductive type dopants implanted in the photodiode region.

8. The CIS of claim 7, wherein the second conductive type dopants includes boron difluoride (BF2) ions.

* * * * *